(12) United States Patent
Crawford et al.

(10) Patent No.: US 6,815,220 B2
(45) Date of Patent: Nov. 9, 2004

(54) MAGNETIC LAYER PROCESSING

(75) Inventors: Ankur Mohan Crawford, Pacifica, CA (US); Donald S. Gardner, Mountain View, CA (US)

(73) Assignee: Intel Corporation, Santa Clara, CA (US)

(*) Notice: Subject to any disclaimer, the term of this patent is extended or adjusted under 35 U.S.C. 154(b) by 88 days.

(21) Appl. No.: 09/772,783

(22) Filed: Jan. 30, 2001

(65) Prior Publication Data

US 2001/0031549 A1 Oct. 18, 2001

Related U.S. Application Data

(63) Continuation of application No. 09/766,162, filed on Jan. 19, 2001, which is a continuation-in-part of application No. 09/444,608, filed on Nov. 23, 1999.

(51) Int. Cl.[7] .............................................. H01L 21/00
(52) U.S. Cl. .............................. 438/3; 438/57; 438/745
(58) Field of Search .......................... 438/3, 57, 745; 427/128

(56) References Cited

U.S. PATENT DOCUMENTS

| | | | |
|---|---|---|---|
| 3,607,462 A | * | 9/1971 | Laing .......................... 148/104 |
| 3,881,244 A | | 5/1975 | Kendall |
| 3,905,883 A | * | 9/1975 | Hanazono et al. .......... 205/666 |
| 4,543,553 A | | 9/1985 | Mandai et al. |
| 4,791,719 A | | 12/1988 | Kobayashi et al. |
| 4,797,648 A | * | 1/1989 | Kaneko et al. .......... 228/124.1 |
| 4,816,784 A | | 3/1989 | Rabjohn |
| 5,047,296 A | | 9/1991 | Miltenberger et al. |
| 5,095,357 A | | 3/1992 | Andoh et al. |
| 5,221,459 A | * | 6/1993 | Okano et al. ............... 205/322 |
| 5,420,558 A | | 5/1995 | Ito et al. |
| 5,446,311 A | | 8/1995 | Ewen et al. |

(List continued on next page.)

FOREIGN PATENT DOCUMENTS

| | | |
|---|---|---|
| EP | 0 295 028 A1 | 12/1988 |
| EP | 0 725 407 A1 | 8/1996 |
| EP | 0 884 783 A2 | 12/1998 |
| JP | 61 020311 A | 1/1986 |
| JP | 06124843 A | 5/1994 |
| JP | 07-272932 | 10/1995 |
| WO | WO 01/39220 A1 | 5/2001 |
| WO | PCT/ US 02/01555 | 10/2002 |

OTHER PUBLICATIONS

Search Report for PCT/US 02/00848, mailed Oct. 15, 2002, 4 pages.

(List continued on next page.)

Primary Examiner—George Fourson
Assistant Examiner—Michelle Estrada
(74) Attorney, Agent, or Firm—Blakely, Sokoloff, Taylor & Zafman LLP

(57) ABSTRACT

A dielectric layer is formed over a substrate comprising a semiconductor material. A magnetic layer is formed over the dielectric layer. The magnetic layer comprises an amorphous alloy comprising cobalt.

24 Claims, 9 Drawing Sheets

U.S. PATENT DOCUMENTS

| | | | |
|---|---|---|---|
| 5,469,399 A | | 11/1995 | Sato et al. |
| 5,530,415 A | | 6/1996 | Takaya et al. |
| 5,583,474 A | * | 12/1996 | Mizoguchi et al. ............ 336/83 |
| 5,609,946 A | | 3/1997 | Korman et al. |
| 5,635,892 A | | 6/1997 | Ashby et al. |
| 5,694,030 A | | 12/1997 | Sato et al. |
| 5,705,287 A | * | 1/1998 | Doerner et al. ....... 428/694 TR |
| 5,801,100 A | | 9/1998 | Lee et al. |
| 5,834,825 A | | 11/1998 | Imai |
| 5,877,533 A | | 3/1999 | Arai et al. |
| 5,892,425 A | | 4/1999 | Kuhn et al. |
| 5,952,704 A | | 9/1999 | Yu et al. |
| 5,961,746 A | | 10/1999 | Nepela |
| 5,976,715 A | | 11/1999 | Chen et al. |
| 6,031,445 A | | 2/2000 | Marty et al. |
| 6,033,782 A | * | 3/2000 | Hubbard et al. ......... 252/62.54 |
| 6,037,649 A | | 3/2000 | Liou |
| 6,040,226 A | | 3/2000 | Wojnarowski et al. |
| 6,067,002 A | | 5/2000 | Fujino et al. |
| 6,103,136 A | * | 8/2000 | Han et al. ..................... 216/22 |
| 6,114,937 A | | 9/2000 | Burghartz et al. |
| 6,121,852 A | | 9/2000 | Mizoguchi et al. |
| 6,166,422 A | | 12/2000 | Qian et al. |
| 6,191,495 B1 | * | 2/2001 | Kossives et al. ............ 257/521 |
| 6,201,287 B1 | | 3/2001 | Forbes |
| 6,207,303 B1 | * | 3/2001 | Tomita ....................... 428/692 |
| 6,240,621 B1 | | 6/2001 | Nellissen et al. |
| 6,281,560 B1 | | 8/2001 | Allen et al. |
| 6,291,305 B1 | | 9/2001 | Huang et al. |
| 6,404,317 B1 | | 6/2002 | Mizoguchi et al. |
| 6,441,715 B1 | | 8/2002 | Johnson |

OTHER PUBLICATIONS

Tomita, Hiroshi et al., "Oblique–Field Annealing Effect for In–Plane Magnetic Anisotropy of Soft Magnetic Co–Nb–Zr Thin Films" IEEE Transactions on Magnetics, May 1994, pp. 13369–1339, vol. 30 No. 3.

Search Report for PCT/US 02/01742, mailed Oct. 18, 2002, 5 pages.

K. Shirakawa, et al., "Thin Film Cloth–Structured Inductor For Magnetic Integrated Circuit," IEEE Transactions on Magnetics, Sep. 1990, pp. 2262–2264, vol. 26, No. 5.

M. Yamaguchi, et al., "Characteristics Of Magnetic Thin–Film Inductors At Large Magnetic Field," IEEE Transactions on Magnetics, Nov. 1995, pp. 4229–4231, vol. 31, No.6.

E. Brandon, et al., "Microinductors For Spacecraft Power Electronics," Magnetic Materials, Processes, and Devices VI Applications to Storage and Microelectromechanical Systems (MEMS), 2001, pp. 559–567, vol. 2000–29, The Electrochemical Society, Inc., Pennington, New Jersey.

Erik J. Brandon, "Passive Components For Systems–On–A–Chip Applications," Center for Integrated Space Microsystems, Jet Propulsion Laboratory.

S.S. Mohan, et al., "Simple Accurate Expressions For Planar Spiral Inductances," IEEE Journal of Solid–State Circuits, Oct. 1999, pp. 1419–1424, vol. 34, No. 10.

Joachim N. Burghartz, "Integrated Multilayer RF Passives in Silicon Technology," IBM Research Division, Yorktown Heights, NY.

Jae Yeong Park, et al., "Batch–Fabricated Microinductors With Electroplated Magnetically Anisotropic and Laminated Alloy Cores," IEEE Transactions on Magnetics, Sep. 1999, pp. 4291–4300, vol. 35, No. 5.

M. Yamaguchi, et al., "MGHz–Drive Magnetic Thin–Film Inductors For RF Integrated Circuits Using Micro–Patterned Granular Film" IEEE, 1990.

Ali M. Niknejad and Robert G. Meyer, "Analysis, Design, and Optimization of Spiral Inductors and Transformers for Si RF Ic's," IEEE Journal of Solid–State Circuits, Oct. 1998, pp. 1470–1481, vol. 33, No. 10.

Donald S. Gardner and Paul A. Flinn, "Mechanical Stress As A Function Of Temperature For Aluminum Alloy Films," Journal of Applied Physics, Feb. 15, 1990, pp. 1831–1845, vol. 67.

M. Baba, et al., "GHz–Drive Magnetic Thin–Film Inductor Using CoNbZr Film," Journal of the Magnetics Society of Japan, 2000.

Y. Kobayashi, et al., "New Type Micro Cloth–Inductor And Transformer With Thin Amorphous Wires And Multi–Thin Coils," IEEE Transactions on Magnetics, Sep. 1992, pp. 3012–3014, vol. 28, No. 5.

H. Matsuki and K. Murakami, "A New Cloth Inductor Using Amorphous Fiber," IEEE Transactions on Magnetics, Sep. 1985, pp. 1738–1740, vol. MAG–21, No. 5.

V. Korenivski and R.B. Van Dover, "Magnetic Film Inductors For Radio Frequency Applications," Journal of Applied Physics, Nov. 15, 1997, pp. 5247–5254, vol. 82.

M. Yamaguchi, et al., "Microfabrication And Characteristics Of Magnetics Thin–Film Inductors In The Ultrahigh Frequency Region," Journal of Applied Physics, Jun. 1, 1999, pp. 7919–7922, vol. 85, No. 11.

John R. Long and Miles A. Copeland, "The Modeling, Characterization, And Design Of Monolithic Inductors For Silicon RF IC's," IEEE Journal of Solid–State Circuits, Mar. 1997, pp. 357–369, vol. 32, No. 3.

M. Yamaguchi, et al., "Magnetic Thin–Film Inductor For RF Integrated Circuits," Extended Abstracts of the 1999 International Conference on Solid–State Devices and Materials, 1999, pp. 580–281, Tokyo.

T. Sato, et al., "New Applications of Nanocrystalline Fe(Co–Fe)–Hf–O Magnetic Films To Micromagnetic Devices," Journal of Applied Physics, Jun. 1, 1998, pp. 6658–6660, vol. 83, No. 11.

A. Fessant, et al., "Influence Of In–Plane Anisotropy And Eddy Currents On The Frequency Spectra Of The Complex Permeability Of Amorphous CoZr Films," IEEE Transactions of Magnetics, Jan. 1993, pp. 82–87, vol. 29, No. 1.

Joachim N. Burghartz, "Progress In RF Inductors On Silicon—Understanding Substrate Losses," IBM Research Division, Yorktown Heights, NY.

S. Yabukami, et al., "Noise Analysis Of A MHz–3 GHz Magnetic Thin Film Permeance Meter," Journal of Applied Physics, Apr. 15, 1999, pp. 5148–5150, vol. 85. No. 8.

Jae Park and Mark G. Allen, "Bar–Type Microinductors and Microtransformers With Electroplated Alloy Cores," Magnetic Devices Research, sponsored by Packaging Research Center.

Erik Brandon, "System On A Chip Integrated Passive Components ($\mu$IRS)".

Mashiro Yamaguchi, "Magnetic Films For Planar Inductive Componets And Devices," Handbook of Thin Film Devices, edited by M.H. Francombe, 2000, pp. 185–186, vol. 4: Magnetic Thin Film Devices.

S.S. Mohan, et al., "Bandwidth Extension In CMOS With Optimized On–Chip Inductors," IEEE Journal of Solid–State Circuits, Mar. 2000, pp. 346–355, vol. 35, No. 3.

S.S. Mohan, et al., "Modeling And Characterization Of On–Chip Transformers," Center for Integrated Systems, Stanford University, Stanford, CA 94305.

M.M. Mojarradi, et al., "Power Management And Distribution For System On A Chip For Space Applications," Jet Propulsion Laboratory, California Institute of Technology, under a contract with the National Aeronautics and Space Administration, Paper No. 284.

Terence O'Donnel, et al., "Microtransformers and Inductors Using Permalloy Thin Films," Preparation, Properties, and Applications of Thin Ferromagnetic Films, Jun. 2000, pp. 45–52.

C. Patrick Yue and S. Simon Wong, "On–Chip Spiral Inductors With Patterned Ground Shields For Si–Based RF IC's," IEEE Journal of Solid–State Circuits, May 1998, pp. 743–752, vol. 33, No. 5.

Donald S. Gardner, United States Patent Application for "Method and Apparatus for Providing Inductor for Integrated Circuit or Integrated Circuit Package".

ROC (Taiwan) Patent Publication No. 386310, published Apr. 1, 2000, 19 pages and Summary, 1 page.

ROC (Taiwan) Patent Publication No. 378417 published Jan. 1, 2000.

ROC (Taiwan) Patent Publication No. 411481 published Nov. 11, 2000.

* cited by examiner

MAGNETIC LAYER PROCESSING

This patent application is a continuation of U.S. patent application Ser. No. 09/766,162, filed Jan. 19, 2001, entitled INTEGRATED INDUCTOR, by Donald S. Gardner, which is a continuation-in-part patent application of U.S. patent application Ser. No. 09/444,608, filed Nov. 23, 1999, entitled METHOD AND APPARATUS FOR PROVIDING INDUCTOR FOR INTEGRATED CIRCUIT OR INTEGRATED CIRCUIT PACKAGE, by Donald S. Gardner.

BACKGROUND OF THE INVENTION

1. Field of the Invention

The present invention relates generally to the field of semiconductor processing. More particularly, the present invention relates to the field of processing magnetic layers.

2. Description of Related Art

Electrical inductors are typically used in a variety of microelectronic circuit applications such as, for example, transformers, power converters, electromagnetic interference (EMI) noise reduction, and radio frequency (RF) and microwave circuitry including oscillators, amplifiers, and matching networks. Because discrete inductive devices result in losses, for example, due to parasitic capacitance and resistance in connecting them to an integrated circuit and because discrete inductive devices incur a relatively high cost for assembly, inductors are preferably fabricated on-chip, that is either integrated on an integrated circuit and/or in a package housing an integrated circuit. Such integrated inductors are designed, to the extent possible, to have a relatively high frequency range and a desirable quality factor $Q=\omega L/R$, where $\omega$ is the operating frequency for the inductor, L is the inductance of the inductor, and R is the resistance of the inductor.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The following detailed description sets forth an embodiment or embodiments in accordance with the present invention for magnetic layer processing. In the following description, details are set forth such as specific materials, parameters, etc. in order to provide a thorough understanding of the present invention. It will be evident, however, that the present invention may be practiced without these details. In other instances, well-known process steps, equipment, etc. have not been described in particular detail so as not to obscure the present invention.

Spiral Inductor Structure

Figure 1:
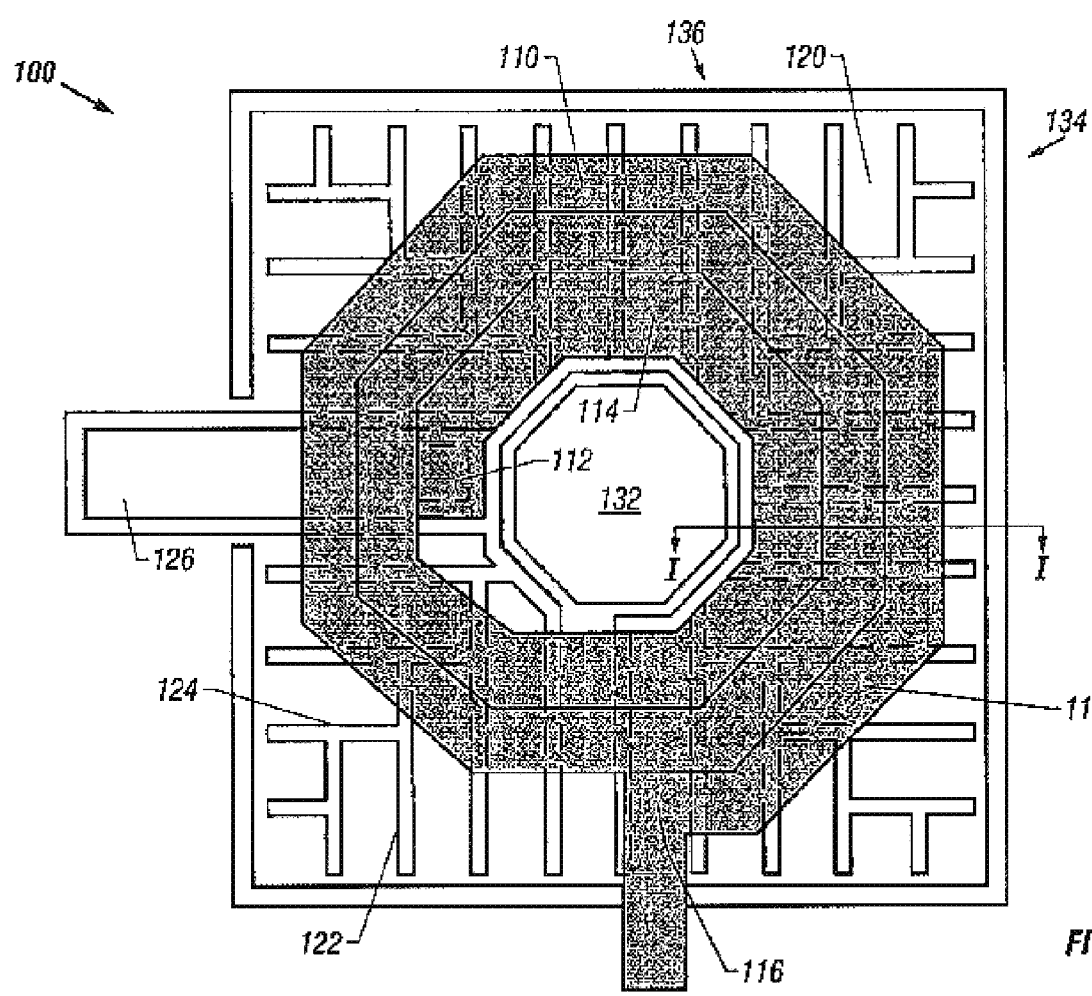
FIG. 1 illustrates, for one embodiment, a plan view of an integrated inductor.

FIG. 1 illustrates, for one embodiment, an integrated inductor 100. Integrated inductor 100 comprises a generally spiral-shaped conductor 110 defining a signal path along which current may flow to generate an electromagnetic field around conductor 110. Current may be induced to flow through conductor 110 by applying a voltage potential across an innermost node 112 near the beginning of an innermost turn 114 of conductor 110 and an outermost node 116 near the end of an outermost turn 118 of conductor 110.

Although illustrated as defining approximately 2¾ generally octagonal-shaped turns, conductor 110 may define any suitable number of one or more turns and any suitable fraction of a turn of any suitable shape. Each turn may be rectangular or circular in shape, for example. Conductor 110 may comprise any suitable conductive material and may have any suitable dimensions. The signal path defined by conductor 110 may have any suitable width, thickness, and length with any suitable spacing between turns to form a generally spiral-shaped conductor 110 covering an area of any suitable shape and size. As used in this description, a spiral or spiral-shaped conductor includes any conductor defining a signal path having at least one turn with each successive turn, if any, substantially surrounding the innermost turn and any preceding turn.

Inductor 100 for one embodiment comprises a magnetic layer 120. Conductor 110 is positioned over magnetic layer 120 and is separated from magnetic layer 120 by at least a dielectric layer. Such a dielectric layer may comprise any suitable dielectric material and have any suitable thickness. The dielectric material and thickness help determine the capacitance and therefore the resonance frequency $\omega_r$ for inductor 100. Magnetic layer 120 forms a voltage reference plane for inductor 100 to help contain electric and magnetic fields around conductor 110. Magnetic layer 120 therefore helps increase the inductance L of inductor 100, and therefore the quality factor Q for inductor 100. Magnetic layer 120 may comprise any suitable magnetic material and have any suitable shape, such as the rectangular shape illustrated in FIG. 1 for example, and any suitable dimensions.

As the quality factor Q of inductor 100 is proportional to the inductance L of inductor 100 and inversely proportional to the resistance R of inductor 100, inductor 100 can be designed with a relatively higher inductance L, and therefore a relatively higher quality factor Q, for a given area or resistance R of inductor 100. Alternatively, for a given inductance L, inductor 100 can be designed with a relatively smaller area and therefore a relatively lower resistance R and capacitance, resulting in a relatively higher resonance frequency $\omega_r$ and a relatively higher quality factor Q.

Inductor 100 for one embodiment is formed over a substrate comprising a semiconductor material with at least a dielectric layer separating magnetic layer 120 from the substrate. Such a dielectric layer may comprise any suitable dielectric material and have any suitable thickness. As conductor 110 generates a magnetic flux toward the substrate that would induce Eddy or mirror currents and therefore noise in the substrate, positioning magnetic layer 120 between the substrate and conductor 110 helps reduce such currents and therefore allows inductor 100 to be formed over integrated circuit devices with minimized concern for interference. Magnetic layer 120 also helps prevent substrate coupling and helps reduce substrate dependency.

Magnetic layer 120 for one embodiment defines slots, such as slots 122 and 124 for example, to help further reduce any Eddy currents in the substrate. Magnetic layer 120 may define any suitable number of one or more slots with any suitable dimensions and orientation at any suitable one or more locations relative to conductor 110. One or more slots may be perpendicular to or at any other suitable angle relative to the flow of current through conductor 110. Defining slots in magnetic layer 120 also reduces Eddy currents that can form in magnetic layer 120 and helps to increase the resonance frequency $\omega_r$ for inductor 100.

Magnetic layer 120 for one embodiment has a relatively high magnetic permeability and a relatively high saturation magnetization to allow inductor 100 to operate at relatively high frequencies, such as in the gigaHertz (GHz) for example, and therefore realize a relatively high quality factor Q for inductor 100. Permeability is a measure of the ability of a magnetic material to magnetize. A non-magnetic material has a relative permeability of one. A magnetic material having a relatively high saturation magnetization allows for relatively high currents to be used.

Magnetic layer 120 for one embodiment is compatible with available semiconductor processing and packaging technology that may be used to form a chip having inductor 100. That is, magnetic layer 120 may be formed and optionally patterned using available semiconductor processing technology and may generally withstand relatively high temperatures encountered in processing and packaging a chip on which inductor 100 is formed without crystallizing or significantly changing the relevant properties of magnetic layer 120.

Magnetic layer 120 for one embodiment comprises cobalt (Co). Magnetic layer 120 for one embodiment comprises an amorphous cobalt (Co) alloy comprising cobalt (Co) and any suitable one or more elements of any suitable atomic or weight percentage. The amorphous cobalt (Co) alloy may have any suitable atomic order. For one embodiment, the amorphous cobalt (Co) alloy has an atomic order in the range of approximately 1 angstrom (Å) to approximately 100 angstroms (Å). For one embodiment, the amorphous cobalt (Co) alloy has an atomic order in the range of approximately 1 angstrom (Å) to approximately 25 angstroms (Å). For one embodiment, the amorphous cobalt (Co) alloy has an atomic order in the range of approximately 1 angstrom (Å) to approximately 10 angstroms (Å).

Magnetic layer 120 for one embodiment comprises an amorphous cobalt (Co) alloy comprising cobalt (Co) and zirconium (Zr). Zirconium (Zr) helps make cobalt (Co) amorphous. Magnetic layer 120 for one embodiment comprises a cobalt-zirconium (CoZr) alloy having one or more additional elements, such as tantalum (Ta) and niobium (Nb) for example, that help make the cobalt-zirconium (CoZr) alloy magnetically softer. Magnetic layer 120 for one embodiment comprises a cobalt-zirconium (CoZr) alloy having one or more additional elements, such as a rare earth element for example, that help increase the ferromagnetic resonance of the cobalt-zirconium (CoZr) alloy. Rare earth elements include rhenium (Re), neodymium (Nd), praseodymium (Pr), and dysprosium (Dy) for example. Rhenium (Re) help reduce stress and magnetostriction for the cobalt-zirconium (CoZr) alloy.

Where magnetic layer 120 comprises a cobalt-zirconium (CoZr) alloy, magnetic layer 120 may comprise, for example, approximately 3 atomic percent to approximately 10 atomic percent zirconium (Zr).

Where magnetic layer 120 comprises a cobalt-zirconium-tantalum (CoZrTa) alloy, magnetic layer 120 may comprise, for example, approximately 3 atomic percent to approximately 10 atomic percent zirconium (Zr) and may comprise up to and including approximately 10 atomic percent tantalum (Ta). Magnetic layer 120 for one embodiment comprises approximately 91.5 atomic percent cobalt (Co), approximately 4 atomic percent zirconium (Zr), and approximately 4.5 atomic percent tantalum (Ta). Such a CoZrTa alloy can operate in the gigaHertz range and can withstand temperatures up to approximately 450° Celsius without crystallizing or significantly changing its relevant properties.

Where magnetic layer 120 comprises a cobalt-zirconium-rhenium (CoZrRe) alloy, magnetic layer 120 may comprise, for example, approximately 3 atomic percent to approximately 10 atomic percent zirconium (Zr) and may comprise up to and including approximately 3 atomic percent rhenium (Re). Magnetic layer 120 for one embodiment comprises approximately 89 atomic percent cobalt (Co), approximately 8 atomic percent zirconium (Zr), and approximately 3 atomic percent rhenium (Re).

Magnetic layer 120 may have any suitable thickness. Magnetic layer 120 for one embodiment has a thickness in the range of approximately 0.05 microns ($\mu$m) to approximately 2.0 microns ($\mu$m). Magnetic layer 120 for one embodiment has a thickness in the range of approximately 0.2 microns ($\mu$m) to approximately 1.0 micron ($\mu$m). Magnetic layer 120 for one embodiment has a thickness of approximately 0.4 microns ($\mu$m).

Inductor 100 for one embodiment comprises another magnetic layer positioned over conductor 110 and separated from conductor 110 by at least a dielectric layer. Such a dielectric layer may comprise any suitable dielectric material and have any suitable thickness. The dielectric material and thickness help determine the capacitance and therefore the resonance frequency $\omega_r$ of inductor 100. The other magnetic layer may comprise any suitable magnetic material and have any suitable shape and dimensions similarly as for magnetic layer 120. The other magnetic layer may or may not comprise the same magnetic material as magnetic layer 120. The other magnetic layer helps further increase the inductance L of inductor 100, and therefore the quality factor Q for inductor 100, when used with magnetic layer 120.

The other magnetic layer for one embodiment defines slots to help reduce Eddy currents and increase the resonance frequency $\omega_r$ for inductor 100. The other magnetic layer may define any suitable number of one or more slots with any suitable dimensions and orientation at any suitable one or more locations relative to conductor 110. One or more slots may be perpendicular to or at any other suitable angle relative to the flow of current through conductor 110.

Inductor 100 may optionally comprise both magnetic layer 120 and the other magnetic layer or only either one of the two magnetic layers. For one embodiment where inductor 100 comprises both magnetic layer 120 and the other magnetic layer, magnetic layer 120 and the other magnetic layer may be connected through a region 132 within innermost turn 114 of conductor 110 and/or at one or more regions, such as regions 134 and 136 for example, along a perimeter surrounding outermost turn 118 of conductor 110. Connecting magnetic layer 120 and the other magnetic layer helps increase the inductance L of inductor 100 and therefore the quality factor Q for inductor 100. Magnetic layer 120 and the other magnetic layer may be connected along a perimeter of any suitable shape, such as the rectangular shape illustrated in FIG. 1 for example. Connecting magnetic layer 120 and the other magnetic layer at most or substantially all regions along a perimeter surrounding conductor 110 helps prevent straying of the magnetic flux generated by conductor 110.

Spiral Inductor Fabrication

Inductor 100 may be fabricated in any suitable manner. For one embodiment, inductor 100 is fabricated in accordance with flow diagram 200 as illustrated in FIG. 2.

Figure 2:
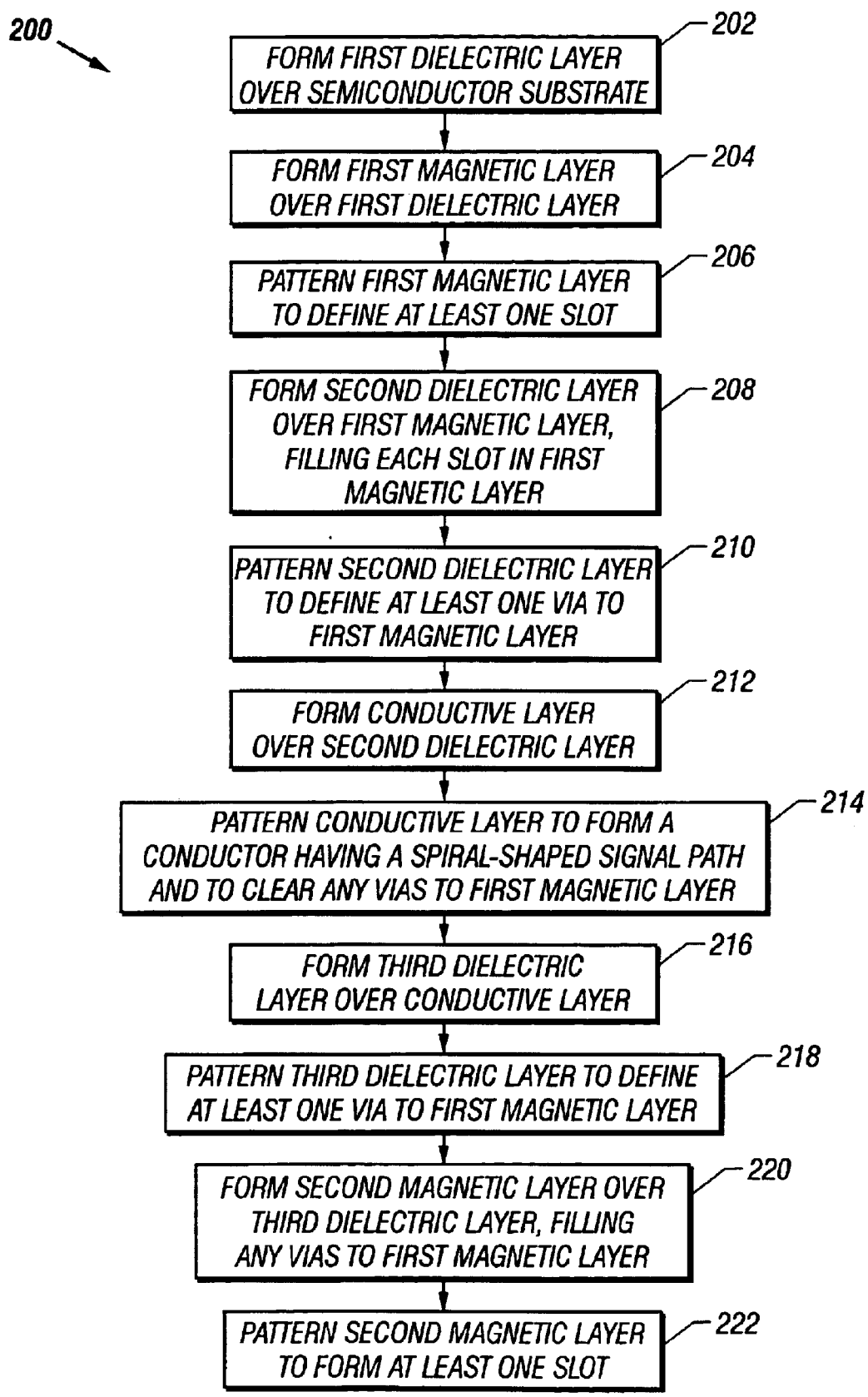
FIG. 2 illustrates, for one embodiment, a flow diagram to form the integrated inductor of FIG. 1.
Figure 3:
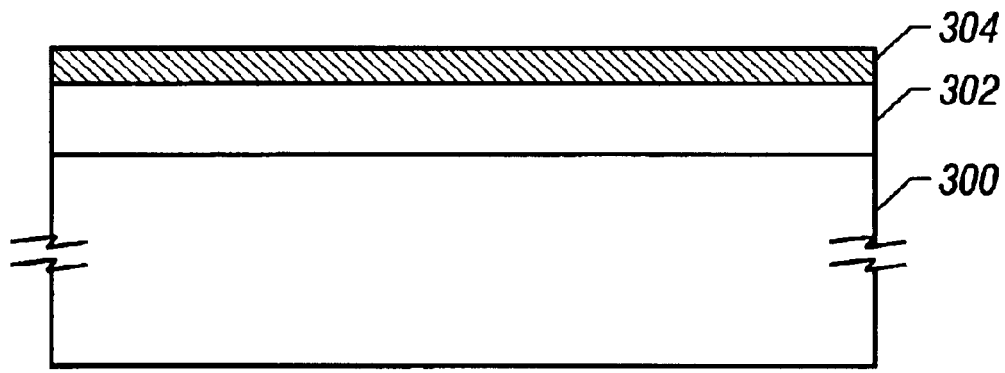
FIG. 3 illustrates, for one embodiment, a cross-sectional view of a substrate over which a first dielectric layer and a magnetic layer are formed.

For block 202 of FIG. 2, a first dielectric layer 302 is formed over a substrate 300 as illustrated in FIG. 3. The cross-sectional view of FIG. 3 generally corresponds a cross-section at line A—A of inductor 100 as illustrated in FIG. 1. Substrate 300 may comprise any suitable semiconductor material, such as silicon (Si), germanium (Ge), or gallium arsenide (GaAs) for example. Dielectric layer 302 may comprise any suitable dielectric material, such as an oxide of silicon for example, and may be formed to any suitable thickness using any suitable technique. Dielectric layer 302 helps insulate inductor 100 from substrate 300. For one embodiment, dielectric layer 302 is formed by depositing silicon dioxide ($SiO_2$) over substrate 300 to a thickness of approximately 2 microns ($\mu$m) using a suitable chemical vapor deposition (CVD) technique. For another embodiment where substrate 300 comprises silicon (Si), dielectric layer 302 may be formed by growing approximately 2 microns ($\mu$m) of silicon dioxide ($SiO_2$) on substrate 300.

Although illustrated in FIG. 3 as forming dielectric layer 302 directly over substrate 300, dielectric layer 302 may be formed over one or more suitable layers, such as one or more interconnect, via, dielectric, and/or device layers for example, formed over substrate 300.

For block 204, a magnetic layer 304 is formed over dielectric layer 302 as illustrated in FIG. 3. Magnetic layer 304 corresponds to magnetic layer 120 of FIG. 1. Magnetic layer 304 may comprise any suitable magnetic material and may be formed to any suitable thickness using any suitable technique. For one embodiment, magnetic layer 304 is formed by sputter depositing an amorphous cobalt (Co) alloy, such as a suitable cobalt-zirconium-tantalum (CoZrTa) alloy for example, to a thickness in the range of approximately 0.2 microns ($\mu$m) to approximately 1.0 micron ($\mu$m) over dielectric layer 302. The magnetic material for one embodiment for magnetic layer 304 may be deposited in the presence of an applied magnetic field to induce desirable magnetic properties in magnetic layer 304.

Figure 4:
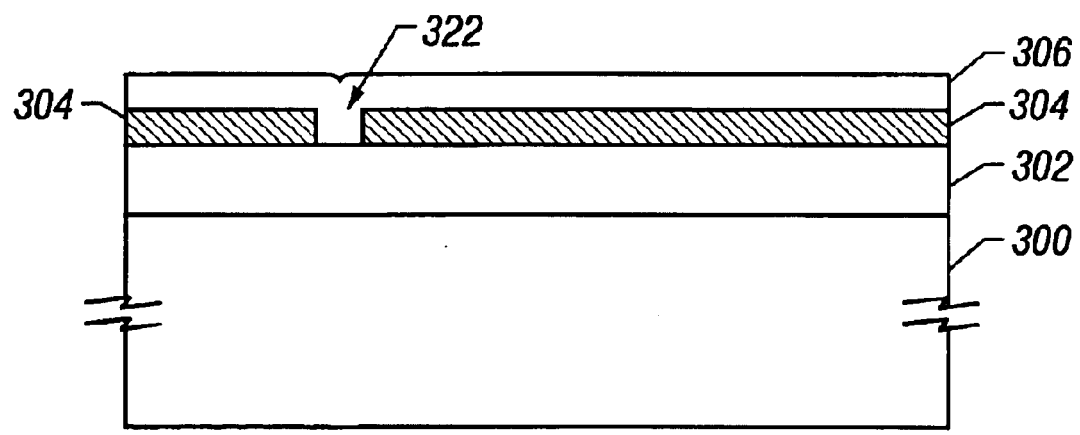
FIG. 4 illustrates, for one embodiment, a cross-sectional view of the substrate of FIG. 3 after the first magnetic layer has been patterned and a second dielectric layer has been formed.

For block 206, magnetic layer 304 is patterned to define at least one slot, such as slot 322 for example, as illustrated in FIG. 4. Magnetic layer 304 may be patterned to define any suitable number of one or more slots with any suitable dimensions and orientation at any suitable one or more locations. Magnetic layer 304 for one embodiment is patterned to define slots having a width in the range of approximately 0.05 microns (em) to approximately 15 microns ($\mu$m). Magnetic layer 304 for one embodiment is patterned to define a conductive underpass 126 to innermost node 112 of inductor 110 as illustrated in FIG. 1 to allow a voltage potential to be applied to node 112.

Magnetic layer 304 may be patterned using any suitable patterning technique. Magnetic layer 304 for one embodiment is patterned by forming a patterned mask over magnetic layer 304, etching magnetic layer 304 to pattern magnetic layer 304 in accordance with the patterned mask, and removing the patterned mask. The patterned mask may comprise any suitable material, such as photoresist for example, formed to any suitable thickness and may be patterned using any suitable technique. Magnetic layer 304 may be etched using any suitable etch technique, such as a suitable wet etching technique for example.

Forming magnetic layer 304 and/or patterning magnetic layer 304 to define one or more slots is optional.

For block 208, a second dielectric layer 306 is formed over magnetic layer 304 as illustrated in FIG. 4. Dielectric layer 306 corresponds to the dielectric layer between magnetic layer 120 and conductor 110 of FIG. 1 and helps insulate magnetic layer 120 from conductor 110. For one embodiment where magnetic layer 304 defines one or more slots, dielectric layer 306 fills each such slot. For one embodiment where magnetic layer 304 is patterned to define conductive underpass 126, dielectric layer 306 fills the slots surrounding conductive underpass 126.

Dielectric layer 306 may comprise any suitable dielectric material, such as an oxide of silicon for example, and may be formed to any suitable thickness using any suitable technique. For one embodiment, dielectric layer 306 is formed by depositing silicon dioxide ($SiO_2$) over magnetic layer 304 to a thickness of approximately 5000 angstroms (Å) using a tetraethyl orthosilicate (TEOS) silicon dioxide ($SiO_2$) plasma enhanced chemical vapor deposition (PECVD) system.

Figure 5:
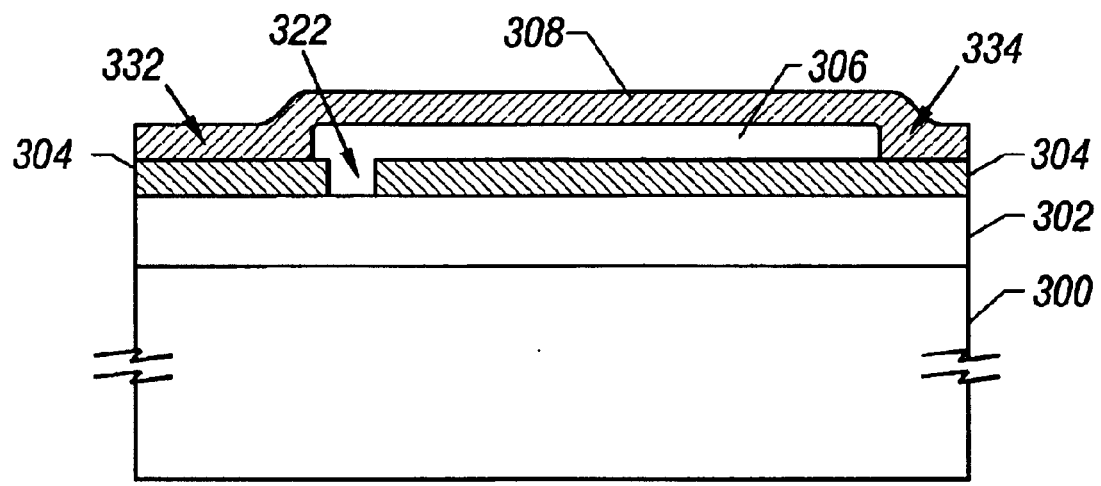
FIG. 5 illustrates, for one embodiment, a cross-sectional view of the substrate of FIG. 4 after the second dielectric layer has been patterned and a conductive layer has been formed.

For block 210, dielectric layer 306 is patterned to define at least one via to magnetic layer 304, such as vias 332 and 334 for example, as illustrated in FIG. 5. Dielectric layer 306 for one embodiment is patterned to define at least one via in region 132 within innermost turn 114 of conductor 110 as illustrated in FIG. 1 to connect magnetic layer 304 with another magnetic layer. Dielectric layer 306 for one embodiment is patterned to define at least one via in one or more regions, such as regions 134 and 136 for example, along a perimeter surrounding outermost turn 118 of conductor 110 as illustrated in FIG. 1. For one embodiment where magnetic layer 304 defines conductive underpass 126 extending across the perimeter to node 112 and conductor 110 defines a conductive connection extending across the perimeter to node 116, as illustrated in FIG. 1, dielectric layer 306 is not patterned with any via along the perimeter in such regions. For one embodiment where magnetic layer 304 defines conductive underpass 126, dielectric layer 306 is patterned to form a via to conductive underpass 126 to connect node 112 to conductive underpass 126.

Dielectric layer 306 may be patterned using any suitable patterning technique. Dielectric layer 306 for one embodiment is patterned by forming a patterned mask over dielectric layer 306, etching dielectric layer 306 to pattern dielectric layer 306 in accordance with the patterned mask, and removing the patterned mask. The patterned mask may comprise any suitable material, such as photoresist for example, formed to any suitable thickness and may be patterned using any suitable technique. Dielectric layer 306 may be etched using any suitable etch technique, such as a suitable dry etch technique for example.

Forming dielectric layer 306 is optional. Dielectric layer 306 may not be formed, for example, where magnetic layer 304 is not formed. Patterning dielectric layer 306 to define one or more vias to magnetic layer 304 is optional. Dielectric layer 306 may not be patterned, for example, where magnetic layer 304 does not define conductive underpass 126 and where magnetic layer 304 is not to be connected to another magnetic layer.

For block 212, a conductive layer 308 is formed over dielectric layer 306 as illustrated in FIG. 5. For one embodiment where dielectric layer 306 defines one or more vias to magnetic layer 304, conductive layer 308 fills any such vias.

Conductive layer 308 may comprise any suitable conductive material and may be formed to any suitable thickness using any suitable technique. Suitable conductive materials include copper (Cu), aluminum (Al), an aluminum-copper (AlCu) alloy, an aluminum-silicon (AlSi) alloy, an aluminum-copper-silicon (AlCuSi) alloy, and polysilicon for example. For one embodiment, conductive layer 308 is formed by sputter depositing an aluminum-copper (AlCu) alloy over dielectric layer 306 to a thickness of approximately 1 micron ($\mu$m). Conductive layer 308 for one embodiment may also be formed to comprise an underlying adhesion and/or diffusion barrier layer and/or an overlying adhesion and/or diffusion barrier layer. Conductive layer 308 may also be formed to comprise any overlying layer to prevent hillocking of the conductive material for conductive layer 308. For one embodiment where conductive layer 308 comprises an aluminum-copper alloy, a titanium (Ti) layer may be deposited prior to depositing the aluminum-copper alloy and another titanium (Ti) layer may be deposited over the deposited aluminum-copper alloy.

Figure 6:
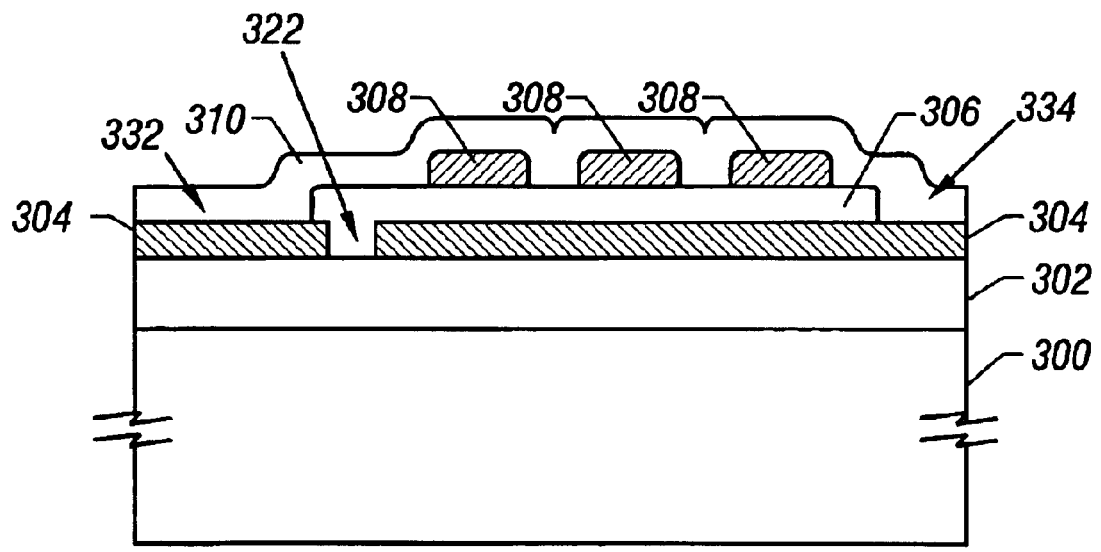
FIG. 6 illustrates, for one embodiment, a cross-sectional view of the substrate of FIG. 5 after the conductive layer has been patterned and a third dielectric layer has been formed.

For block 214, conductive layer 308 is patterned to form conductor 110 as illustrated in FIGS. 1 and 6. Conductive layer 308 may be patterned to define a signal path having any suitable width, thickness, and length and any suitable spacing between turns to form a generally spiral-shaped conductor 110 covering an area of any suitable shape and size. For one embodiment where dielectric layer 306 defines one or more vias to magnetic layer 304, conductive layer 308 is also patterned to remove conductive layer 308 from any such vias. Where magnetic layer 304 defines conductive underpass 126, however, conductive layer 308 for one embodiment is not removed from any via to conductive underpass 126. In this manner, conductive layer 308 helps connect conductive underpass 126 to node 112 of conductor 110.

Conductive layer 308 may be patterned using any suitable patterning technique. Conductive layer 308 for one embodiment is patterned by forming a patterned mask over conductive layer 308, etching conductive layer 308 to pattern conductive layer 308 in accordance with the patterned mask, and removing the patterned mask. The patterned mask may comprise any suitable material, such as a photoresist and a silicon dioxide ($SiO_2$) hard mask for example, formed to any suitable thickness and may be patterned using any suitable technique. Conductive layer 308 may be etched using any suitable etch technique, such as a suitable plasma dry etching technique for example.

For block 216, a third dielectric layer 310 is formed over conductive layer 308 as illustrated in FIG. 6. Dielectric layer 310 for one embodiment helps insulate conductive layer 308 from another magnetic layer. Dielectric layer 310 fills the areas removed from conductive layer 308 in patterning conductive layer 308 to form conductor 110. Dielectric layer 310 also fills any exposed vias in dielectric layer 306.

Dielectric layer 310 may comprise any suitable dielectric material, such as an oxide of silicon for example, and may be formed to any suitable thickness using any suitable technique. For one embodiment, dielectric layer 310 is formed by depositing silicon dioxide ($SiO_2$) over conductive layer 308 to a thickness of approximately 5000 angstroms (Å) using a tetraethyl orthosilicate (TEOS) silicon dioxide ($SiO_2$) plasma enhanced chemical vapor deposition (PECVD) system.

Figure 7:
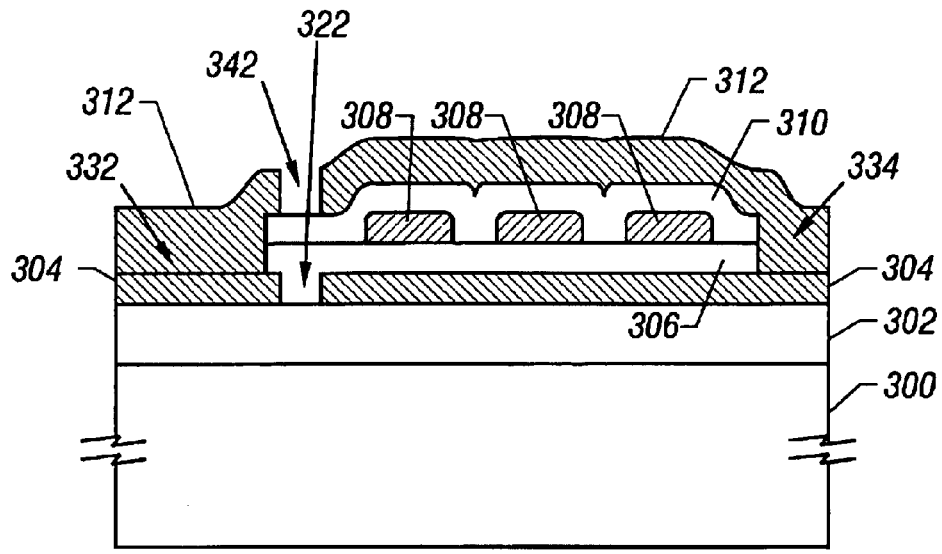
FIG. 7 illustrates, for one embodiment, a cross-sectional view of the substrate of FIG. 6 after the third dielectric layer has been patterned and a second magnetic layer has been formed and patterned.

For block 218, dielectric layer 310 is patterned to define at least one via extending to magnetic layer 304 as illustrated in FIG. 7. Dielectric layer 310 for one embodiment is patterned to define a via extending through each exposed via defined by dielectric layer 306.

Dielectric layer 310 may be patterned using any suitable patterning technique. Dielectric layer 310 for one embodiment is patterned by forming a patterned mask over dielectric layer 310, etching dielectric layer 310 to pattern dielectric layer 310 in accordance with the patterned mask, and removing the patterned mask. The patterned mask may comprise any suitable material, such as photoresist for example, formed to any suitable thickness and may be patterned using any suitable technique. Dielectric layer 310 may be etched using any suitable etch technique, such as a suitable dry etch technique for example.

Forming dielectric layer 310 is optional. Dielectric layer 310 may not be formed, for example, where another magnetic layer is not to be formed over conductive layer 308. Patterning dielectric layer 310 to define one or more vias to magnetic layer 304 is optional. Dielectric layer 310 may not be patterned, for example, where magnetic layer 304 is not formed or where magnetic layer 304 is not to be connected to another magnetic layer formed over conductive layer 308.

For block 220, a second magnetic layer 312 is formed over dielectric layer 302 as illustrated in FIG. 7. For one embodiment where dielectric layers 306 and 310 define one or more vias to magnetic layer 304, magnetic layer 312 fills any such vias. In this manner, magnetic layer 312 helps form one or more connections between magnetic layer 304 and magnetic layer 312.

Magnetic layer 312 may comprise any suitable magnetic material and may be formed to any suitable thickness using any suitable technique. For one embodiment, magnetic layer 312 is formed by sputter depositing an amorphous cobalt (Co) alloy, such as a suitable cobalt-zirconium-tantalum (CoZrTa) alloy for example, to a thickness in the range of approximately 0.2 microns ($\mu$m) to approximately 1.0 micron ($\mu$m) over dielectric layer 310. The magnetic material for one embodiment for magnetic layer 312 may be deposited in the presence of an applied magnetic field to induce desirable magnetic properties in magnetic layer 312.

For block 222, magnetic layer 312 is patterned to define at least one slot, such as slot 342 for example, as illustrated in FIG. 7. Magnetic layer 312 may be patterned to define any suitable number of one or more slots with any suitable dimensions and orientation at any suitable one or more locations. Magnetic layer 312 for one embodiment is patterned to define slots having a width in the range of approximately 0.05 microns (μm) to approximately 15 microns (μm).

Magnetic layer 312 may be patterned using any suitable patterning technique. Magnetic layer 312 for one embodiment is patterned by forming a patterned mask over magnetic layer 312, etching magnetic layer 312 to pattern magnetic layer 312 in accordance with the patterned mask, and removing the patterned mask. The patterned mask may comprise any suitable material, such as photoresist for example, formed to any suitable thickness and may be patterned using any suitable technique. Magnetic layer 312 may be etched using any suitable etch technique.

Forming magnetic layer 312 and/or patterning magnetic layer 312 to define one or more slots is optional.

Although illustrated as comprising conductive underpass 126 defined by magnetic layer 304, inductor 100 for another embodiment may instead comprise a similar conductive overpass defined by magnetic layer 312 to allow a voltage potential to be applied to node 112.

For another embodiment, inductor 100 may be fabricated such that a voltage potential may be applied to node 112 and/or node 116 from beneath magnetic layer 304. Also, inductor 100 may be fabricated such that a voltage potential may be applied to node 112 and/or node 116 from above magnetic layer 312. Nodes 112 and/or 116 may be conductively coupled to a respective contact beneath and/or above inductor 100 by forming a respective via through magnetic layer 304 and/or magnetic layer 312 and filling the via with a suitable conductive material. For another embodiment, a portion of magnetic layer 304 and/or magnetic layer 312 may be isolated to serve as a conductive contact in conductively coupling nodes 112 and/or 116 to a respective contact beneath and/or above inductor 100. By conductively coupling both nodes 112 and 116 through magnetic layer 304 and/or magnetic layer 312 in this manner, magnetic layers 304 and 312 may be connected continuously along the full perimeter surrounding outermost turn 118.

For one embodiment where inductor 100 comprises only magnetic layer 304 or magnetic layer 312, dielectric layer 306 and/or dielectric layer 310 may nevertheless be patterned with at least one via in region 132 and/or in one or more regions along a perimeter surrounding conductor 110, as illustrated in FIG. 1, for subsequent filling with a suitable magnetic material.

Inductor 100 for another embodiment is fabricated using a suitable damascene process to form conductor 110. Rather than forming and patterning conductive layer 308, dielectric layer 306 or another dielectric layer formed over dielectric layer 306 may be patterned to define suitable trenches and/or vias such that a conductive material, such as copper (Cu) for example, may be deposited over the dielectric layer and polished with a suitable chemical-mechanical polishing (CMP) technique, for example, to form conductor 110. One or more vias to magnetic layer 304 may then be defined through the dielectric layer.

Magnetic Layer Processing

Figure 8:
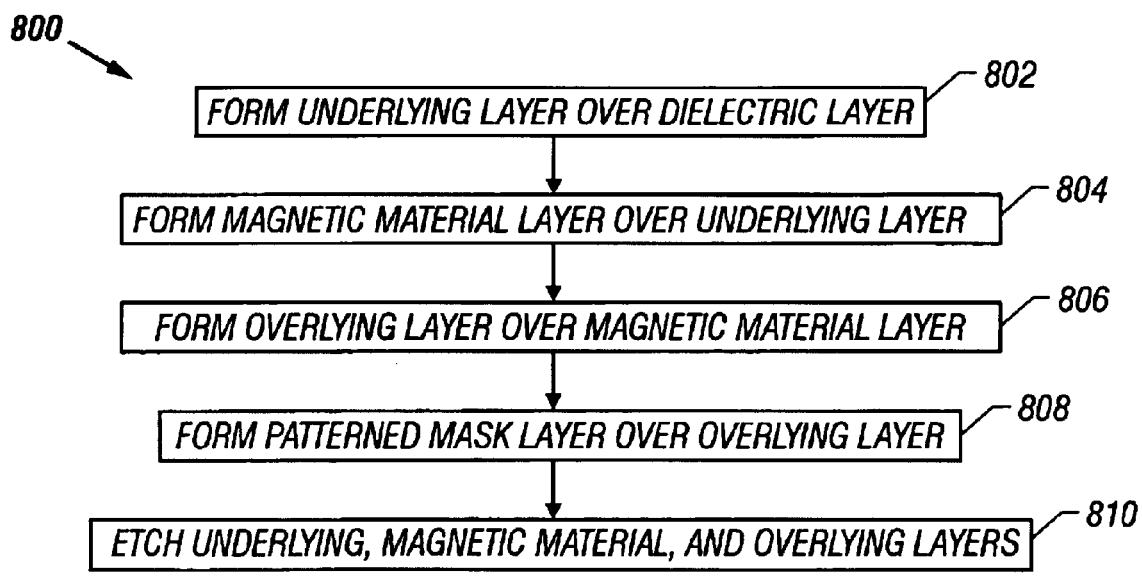
FIG. 8 illustrates, for one embodiment, a flow diagram to form a magnetic layer.

Magnetic layers 304 and 312 may each be formed and patterned in any suitable manner. For one embodiment, each magnetic layer 304 and 312 is formed and patterned in accordance with flow diagram 800 as illustrated in FIG. 8. Flow diagram 800 is described in the context of magnetic layer 304 for the sake of simplicity.

Figure 9:
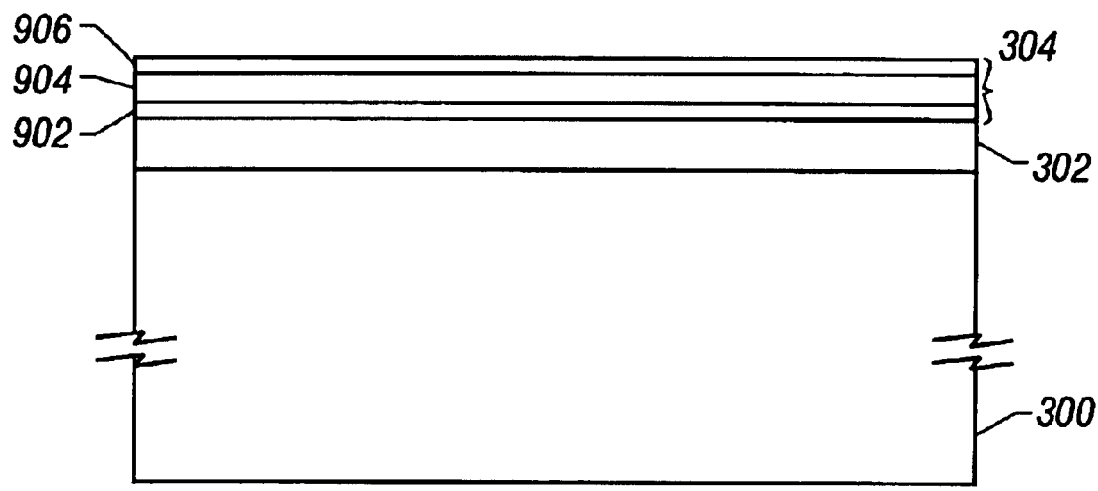
FIG. 9 illustrates, for one embodiment, a cross-sectional view of a substrate over which a dielectric layer and a magnetic layer have been formed.

For block 802 of FIG. 8, an underlying layer 902 is formed over dielectric layer 302 as illustrated in FIG. 9. Layer 902 may serve as an adhesion layer and/or as a diffusion barrier layer for magnetic layer 304.

Layer 902 may comprise any suitable material and may be formed to any suitable thickness using any suitable technique. For one embodiment where the magnetic material for magnetic layer 304 comprises an amorphous cobalt (Co) alloy, such as CoZrTa for example, titanium (Ti) may be sputter deposited over dielectric layer 302 to a suitable thickness, such as approximately 250 angstroms (Å) for example, using a physical vapor deposition (PVD) system, for example, to form layer 902. Titanium (Ti) helps the cobalt (Co) alloy adhere to dielectric layer 302.

Layer 902 is optional and may not be used, for example, where adhesion and/or diffusion are of minimized concern for the magnetic material of magnetic layer 304.

For block 804 of FIG. 8, a magnetic material layer 904 is formed over underlying layer 902 as illustrated in FIG. 9. Magnetic material layer 904 may comprise any suitable material and may be formed to any suitable thickness using any suitable technique.

Magnetic material layer 904 for one embodiment comprises cobalt (Co). Magnetic material layer 904 for one embodiment comprises an amorphous cobalt (Co) alloy comprising cobalt (Co) and any suitable one or more elements of any suitable atomic or weight percentage. The amorphous cobalt (Co) alloy may have any suitable atomic order. For one embodiment, the amorphous cobalt (Co) alloy has an atomic order in the range of approximately 1 angstrom (Å) to approximately 100 angstroms (Å). For one embodiment, the amorphous cobalt (Co) alloy has an atomic order in the range of approximately 1 angstrom (Å) to approximately 25 angstroms (Å). For one embodiment, the amorphous cobalt (Co) alloy has an atomic order in the range of approximately 1 angstrom (Å) to approximately 10 angstroms (Å).

Magnetic material layer 904 for one embodiment comprises an amorphous cobalt (Co) alloy comprising cobalt (Co) and zirconium (Zr). Zirconium (Zr) helps make cobalt (Co) amorphous. Magnetic material layer 904 for one embodiment comprises a cobalt-zirconium (CoZr) alloy having one or more additional elements, such as tantalum (Ta) and niobium (Nb) for example, that help make the cobalt-zirconium (CoZr) alloy magnetically softer. Magnetic material layer 904 for one embodiment comprises a cobalt-zirconium (CoZr) alloy having one or more additional elements, such as a rare earth element for example, that help increase the ferromagnetic resonance of the cobalt-zirconium (CoZr) alloy. Rare earth elements include rhenium (Re), neodymium (Nd), praseodymium (Pr), and dysprosium (Dy) for example. Rhenium (Re) helps reduce stress and magnetostriction for the cobalt-zirconium (CoZr) alloy.

Where magnetic material layer 904 comprises a cobalt-zirconium (CoZr) alloy, magnetic material layer 904 may comprise, for example, approximately 3 atomic percent to approximately 10 atomic percent zirconium (Zr).

Where magnetic material layer 904 comprises a cobalt-zirconium-tantalum (CoZrTa) alloy, magnetic material layer 904 may comprise, for example, approximately 3 atomic percent to approximately 10 atomic percent zirconium (Zr) and may comprise up to and including approximately 10 atomic percent tantalum (Ta). Magnetic material layer 904 for one embodiment comprises approximately 91.5 atomic percent cobalt (Co), approximately 4 atomic percent zirconium (Zr), and approximately 4.5 atomic percent tantalum (Ta). Such a CoZrTa alloy can operate in the gigaHertz range and can withstand temperatures up to approximately 450° Celsius without crystallizing or significantly changing its relevant properties.

Where magnetic material layer 904 comprises a cobalt-zirconium-rhenium (CoZrRe) alloy, magnetic material layer 904 may comprise, for example, approximately 3 atomic percent to approximately 10 atomic percent zirconium (Zr) and may comprise up to and including approximately 3 atomic percent rhenium (Re). Magnetic material layer 904 for one embodiment comprises approximately 89 atomic percent cobalt (Co), approximately 8 atomic percent zirconium (Zr), and approximately 3 atomic percent rhenium (Re).

Magnetic material layer 904 may be formed to any suitable thickness. Magnetic material layer 904 for one embodiment has a thickness in the range of approximately 0.05 microns ($\mu$m) to approximately 2.0 microns ($\mu$m). Magnetic material layer 904 for one embodiment has a thickness in the range of approximately 0.2 microns ($\mu$m) to approximately 1.0 micron ($\mu$m). Magnetic material layer 904 for one embodiment has a thickness of approximately 0.4 microns ($\mu$m).

Magnetic material layer 904 for one embodiment is sputter deposited using a physical vapor deposition (PVD) system, for example. Magnetic material layer 904 for one embodiment is deposited in the presence of an applied magnetic field to induce desirable magnetic properties in magnetic material layer 904. Magnetic material layer 904 may be deposited, for example, in the presence of a fixed magnetic field, an approximately 180° switching magnetic field, or an orthogonal switching magnetic field.

Magnetic material layer 904 for one embodiment may be deposited in sublayers of any suitable thickness, such as approximately 0.2 microns ($\mu$m) for example, to help prevent overheating and crystal growth during deposition. Each sublayer for one embodiment may be deposited in the presence of a magnetic field in such a manner so as to induce a magnetic anisotrophy in the sublayer in a direction parallel to the plane of the sublayer and orthogonal to that of another sublayer. Each sublayer may, for example, be deposited in the presence of an orthogonal switching magnetic field. Substrate 300 may also be repositioned relative to a fixed magnetic field as each sublayer is deposited so as to induce the orthogonal magnetic fields.

For block 806 of FIG. 8, an overlying layer 906 is formed over magnetic material layer 904 as illustrated in FIG. 9. Layer 906 may serve as an adhesion layer and/or as a diffusion barrier layer for magnetic layer 304. Layer 906 may comprise any suitable material and may be formed to any suitable thickness using any suitable technique.

For one embodiment where magnetic material layer 904 comprises cobalt (Co), titanium (Ti) may be sputter deposited over magnetic material layer 904 to a suitable thickness, such as approximately 250 angstroms (Å) for example, using a physical vapor deposition (PVD) system, for example, to form layer 906. Titanium (Ti) helps cobalt (Co) adhere to photoresist in patterning magnetic layer 304, helps protect cobalt (Co) from relatively high temperature processes that could potentially oxidize the top surface of magnetic material layer 904 and possibly damage the relevant properties of cobalt (Co), and may help reduce any undercutting in etching magnetic material layer 904.

For another embodiment where magnetic material layer 904 comprises cobalt (Co), magnetic material layer 904 is oxidized to form layer 906 comprising cobalt oxide ($CoO_x$). Cobalt oxide ($CoO_x$) may be formed to any suitable thickness, such as in the range of approximately 10 angstroms (Å) to approximately 100 angstroms (Å) for example. Magnetic material layer 904 for one embodiment is briefly ashed with a suitable relatively low lamp, low temperature recipe to oxidize cobalt (Co) while minimizing any damage to the relevant properties of cobalt (Co). Oxidizing cobalt (Co) in this manner helps cobalt (Co) adhere to photoresist in patterning magnetic layer 304.

Layer 906 is optional and may not be used, for example, where adhesion is of minimized concern for the magnetic material of magnetic layer 304.

Figure 10:
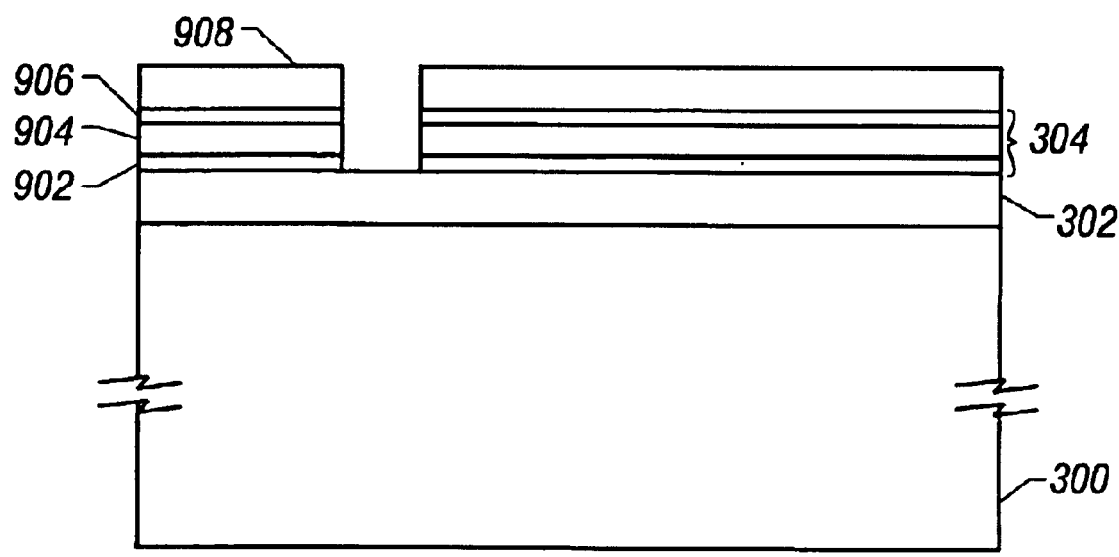
FIG. 10 illustrates, for one embodiment, a cross-sectional view of the substrate of FIG. 9 after a patterned mask layer has been formed and the magnetic layer has been patterned.

For block 808, a patterned mask layer 908 is formed over magnetic layer 304 as illustrated in FIG. 10. Mask layer 908 may comprise any suitable material and may have any suitable thickness. Mask layer 908 may be patterned using any suitable technique. Mask layer 908 for one embodiment comprises photoresist that is spun on and then patterned by exposing mask layer 908 through a suitable mask and developing mask layer 908.

For block 810, underlying layer 902, magnetic material layer 904, and overlying layer 906 are etched as illustrated in FIG. 10. Magnetic layer 304 for one embodiment is etched using a suitable wet etching technique. For one embodiment where layer 906 comprises titanium (Ti) or cobalt oxide ($CoO_x$), a suitable dilute hydrofluoric (HF) acid solution is used to etch layer 906 exposed by mask layer 908. For one embodiment, an approximately 50:1 HF acid solution is used. For one embodiment where magnetic material layer 904 comprises cobalt (Co), a solution of nitric acid is used to wet etch magnetic material layer 904 exposed by mask layer 908. For one embodiment, an approximately 10% solution of nitric ($HNO_3$) acid is used. For one embodiment where layer 906 comprises titanium (Ti), layer 906 helps reduce any undercutting in wet etching magnetic material layer 904. For one embodiment where layer 902 comprises titanium (Ti), a suitable dilute hydrofluoric (HF) acid solution is used to etch layer 902 exposed by mask layer 908. For one embodiment, an approximately 50:1 HF acid solution is used.

As substrate 300 is further processed in accordance with flow diagram 200 of FIG. 2, for example, each subsequent process technique is to account for the presence of magnetic layer 304. As one example where magnetic layer 304 comprises cobalt (Co), exposing magnetic layer 304 to a plasma or atmosphere containing oxygen at relatively high temperatures may damage the relevant properties of magnetic layer 304. The effects of subsequent process techniques on magnetic layer 304 may be monitored using a permeance meter, for example.

For one embodiment where magnetic layer 304 comprises cobalt (Co), silicon dioxide ($SiO_2$) is deposited to form dielectric layer 306, for example, using a suitable plasma enhanced chemical vapor deposition (PECVD) system with tetraethyl orthosilicate (TEOS) to help minimize oxidation and crystallization of magnetic layer 304.

For one embodiment where photoresist, for example, is to be removed from magnetic layer 304, dielectric layer 306, and/or from a silicon dioxide ($SiO_2$) hard mask over conductive layer 308, a suitable relatively low temperature resist strip technique and a suitable solvent may be used instead of a typical relatively high temperature ash technique to avoid exposing magnetic layer 304 to plasmas at relatively high temperatures for relatively long periods of time. For another embodiment where photoresist, for example, is used in etching silicon dioxide ($SiO_2$), such as for dielectric layer 306 for example, the silicon dioxide ($SiO_2$) may be etched using a suitable relatively low power and relatively low temperature dry etch technique to help minimize any hardening of the photoresist. The photoresist may then be removed using a suitable solvent.

Following fabrication of inductor 100 with magnetic layer 304 and/or magnetic layer 312, magnetic layer 304 and/or magnetic layer 312 may be annealed by exposing inductor 100 to a suitable temperature in the presence of a magnetic field to help vitalize the magnetic properties of magnetic layer 304 and/or magnetic layer 312.

Although described in the context of inductor 100, one or more magnetic layers may be formed and possibly patterned in fabricating or packaging any suitable integrated circuit.

Low Resistance Inductor Fabrication

Figure 11:
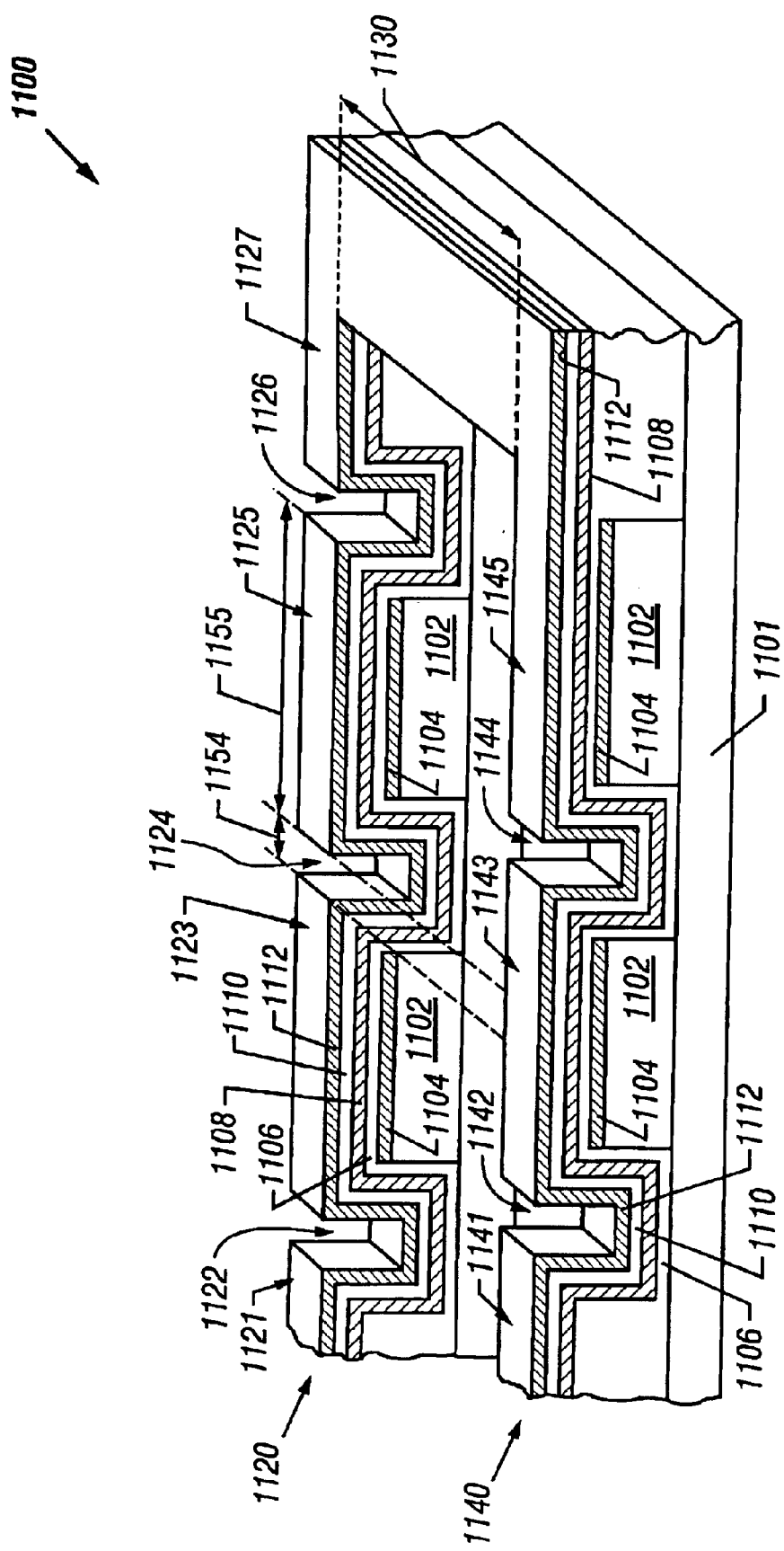
FIG. 11 illustrates, for one embodiment, a perspective view of another integrated inductor.

One or more magnetic layers may be formed and possibly patterned, for example, in fabricating an inductor 1100 as illustrated in FIG. 11.

Inductor 1100 comprises a conductive layer 1108 defining a signal path along a row 1120 of alternating pedestals 1121, 1123, 1125, and 1127 and trenches 1122, 1124, and 1126, across an interconnect portion 1130, and along another row 1140 of alternating pedestals 1141, 1143, and 1145 and trenches 1142 and 1144. Although illustrated as defining two rows 1120 and 1140, inductor 1100 may define any suitable number of one or more rows of any suitable number of one or more pedestals and trenches.

Current may flow along the signal path in opposite directions for each adjacent row to generate an electromagnetic field. Because the signal path is defined along rows rather than turns in a spiral, inductor 1100 may be fabricated to define a relatively wide signal path and may therefore be fabricated with a lower resistance relative to inductor 100. Also, unlike inductor 100 where magnetic flux is driven into its supporting substrate, inductor 1100 generates a magnetic flux parallel to its supporting substrate, reducing concern for induced Eddy currents in the substrate.

Conductive layer 1108 comprises a lower segment for each trench, such as lower segment 1154 for trench 1124 for example, and an upper segment for each pedestal, such as upper segment 1155 for pedestal 1125 for example. For one embodiment, each upper segment may be relatively longer than each lower segment. For other embodiments, the relative length of the upper and lower segments may differ. The length of each row for one embodiment is substantially greater than its width.

For one embodiment, the pedestals and trenches in each row are displaced by approximately 180° from the pedestals and trenches in an adjacent row to help align the magnetic flux across each row and therefore help increase the resulting inductance of inductor 1100. Inductor 1100 may optionally comprise a magnetic layer 1104 beneath conductive layer 1108 in each pedestal and/or a magnetic layer 1112 over conductive layer 1108 in each trench to help increase the inductance of inductor 1100. Each pedestal may optionally have magnetic layer 1112 over conductive layer 1108. For other embodiments, displacement of pedestals and trenches between adjacent rows may differ from 180°.

Figure 12:
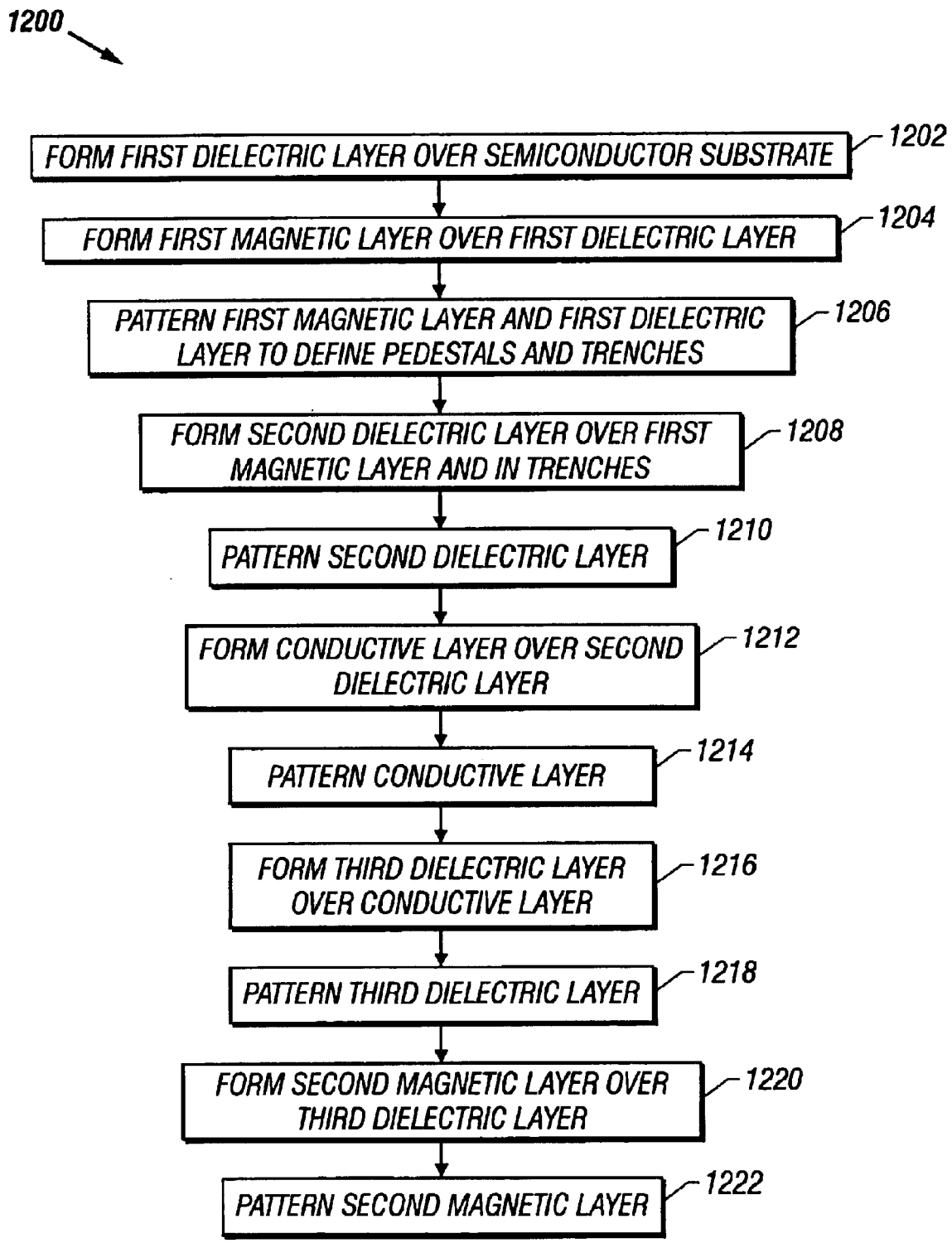
FIG. 12 illustrates, for one embodiment, a flow diagram to form the integrated inductor of FIG. 11.

Inductor 1100 may be fabricated in any suitable manner. For one embodiment, inductor 1100 is fabricated in accordance with flow diagram 1200 as illustrated in FIG. 12. The processing techniques described in connection with blocks 202–222 of FIG. 2 are generally applicable to blocks 1202–1222, respectively, of FIG. 12 except where noted.

For block 1202 of FIG. 12, a first dielectric layer 1102 is formed over a substrate 1101 comprising semiconductor material. A first magnetic layer 1104 is formed for block 1204 over dielectric layer 1102. Magnetic layer 1104 is patterned for block 1206 to help define pedestals and trenches for inductor 1100.

Unlike block 206 of FIG. 2 where dielectric layer 302 is not patterned to fabricate inductor 100, dielectric layer 1102 is patterned for block 1206 as well to help define pedestals and trenches for inductor 1100. For one embodiment where dielectric layer 1102 comprises silicon dioxide ($SiO_2$) and photoresist is used to pattern dielectric layer 1102, a relatively high power dry etch technique may be used followed by use of a suitable relatively low temperature resist strip technique and a suitable solvent to remove the photoresist.

A second dielectric layer 1106 is formed for block 1208 over magnetic layer 1104 and along the walls and bottom of the trenches for inductor 1100. Dielectric layer 1106 is patterned for block 1210. A conductive layer 1108 is formed for block 1212 over dielectric layer 1106. Conductive layer 1108 is patterned for block 1214 to form a conductor defining a signal path along one or more rows of pedestals and trenches.

A third dielectric layer 1110 is formed for block 1216 over conductive layer 1108. Dielectric layer 1110 is patterned for block 1218. A second magnetic layer 1112 is formed for block 1220 over dielectric layer 1110. Magnetic layer 1112 is patterned for block 1222.

Integrated Circuit and Integrated Circuit Package

Figure 13:
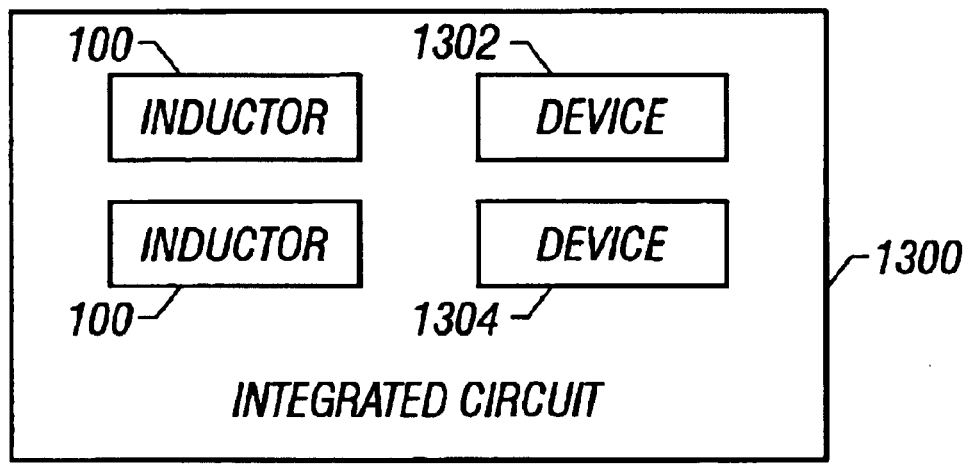
FIG. 13 illustrates, for one embodiment, a block diagram of an integrated circuit comprising one or more inductors.

As illustrated in block diagram form in FIG. 13, inductor 100 for one embodiment may be integrated in an integrated circuit 1300 with any suitable one or more integrated circuit devices, such as integrated circuit devices 1302 and 1304 for example, or with any suitable circuits comprising one or more integrated circuit devices, such as integrated circuit devices 1302 and 1304 for example. Although illustrated as comprising two inductors 100, integrated circuit 1300 may be fabricated with any suitable number of one or more inductors 100 and/or 1100 and/or any other suitable inductor having one or more magnetic layers.

Figure 14:
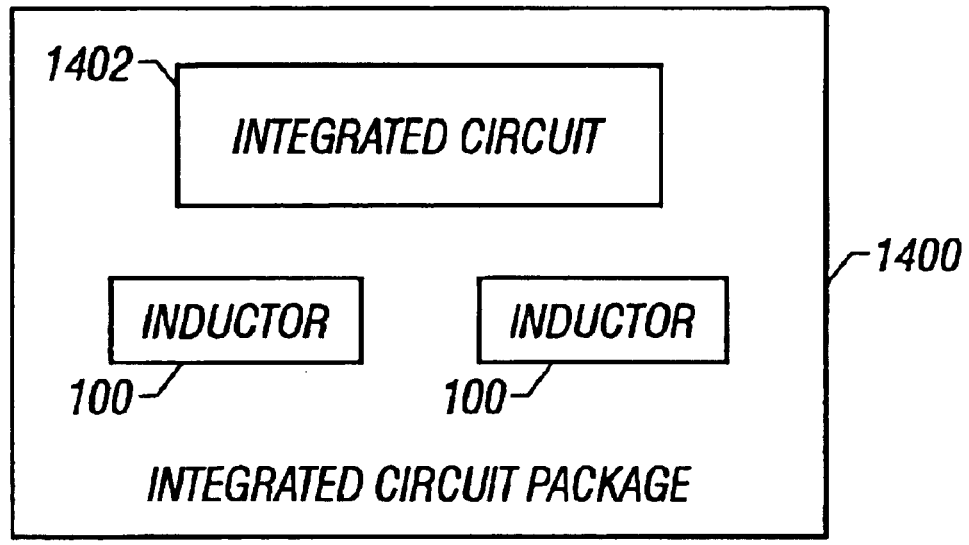
FIG. 14 illustrates, for one embodiment, a block diagram of an integrated circuit package comprising one or more inductors.

As illustrated in block diagram form in FIG. 14, inductor 100 for one embodiment may be mounted in an integrated circuit package 1400 for conductive coupling to an integrated circuit 1402 housed by integrated circuit package 1400. Inductor 100 may be integrated with or mounted in integrated circuit package 1400 and conductively coupled to integrated circuit 1402 in any suitable manner. Although illustrated as comprising two inductors 100, integrated circuit package 1400 may be fabricated with any suitable number of one or more inductors 100 and/or 1100 and/or any other suitable inductor having one or more magnetic layers.

Although described in connection with inductor 100 and inductor 1100, magnetic layers may be integrated in the fabrication of other suitable inductors having other suitable structures. As one example, inductor 100 may be fabricated with a multi-level conductor formed across multiple layers and/or with multiple conductors.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method comprising:
   forming a first dielectric layer over a semiconductor substrate;

depositing a first magnetic layer comprising an amorphous alloy which includes cobalt over the first dielectric layer;

patterning the first magnetic layer using a mask;

forming a second dielectric layer over the first magnetic layer;

depositing a conductive layer over the second dielectric layer;

forming a third dielectric layer over the conductive layer; and patterning a second magnetic layer over the third dielectric layer to put the second magnetic layer in contact with the first magnetic layer and to form an inductor as part of a semiconductor based integrated circuit.

2. The method of claim 1, wherein the amorphous alloy comprises cobalt and zirconium.

3. The method of claim 2, wherein the amorphous alloy comprises approximately 3 atomic percent to approximately 10 atomic percent zirconium.

4. The method of claim 1, wherein the amorphous alloy comprises cobalt, zirconium, and tantalum.

5. The method of claim 4, wherein the amorphous alloy comprises approximately 3 atomic percent to approximately 10 atomic percent zirconium and up to and including approximately 10 atomic percent tantalum.

6. The method of claim 5, wherein the amorphous alloy comprises approximately 4 atomic percent zirconium and approximately 4.5 atomic percent tantalum.

7. The method of claim 1, wherein the amorphous alloy comprises cobalt, zirconium, and niobium.

8. The method of claim 1, wherein the amorphous alloy comprises cobalt, zirconium, and a rare earth element.

9. The method of claim 8, wherein the amorphous alloy comprises cobalt; zirconium; and one of the group consisting of rhenium, neodymium, praseodymium and dysprosium.

10. The method of claim 8, wherein the amorphous alloy comprises approximately 3 atomic percent to approximately 10 atomic percent zirconium and up to and including approximately 3 atomic percent rhenium.

11. The method of claim 1, further comprising forming an underlying adhesion layer under the magnetic layer.

12. The method of claim 11, wherein the underlying adhesion layer comprises titanium.

13. The method of claim 1, further comprising depositing the magnetic layer in a fixed or switching magnetic field.

14. The method of claim 1, further comprising forming an overlying adhesion layer over the magnetic layer.

15. The method of claim 14, wherein the overlying adhesion layer comprises titanium or cobalt oxide.

16. The method of claim 14, wherein the overlying adhesion layer comprises oxidizing the magnetic layer.

17. The method of claim 1, wherein the patterning comprises etching an adhesion layer for the magnetic layer using a hydrofluoric acid solution.

18. The method of claim 1, wherein the patterning comprises wet etching the magnetic layer using a nitric acid solution.

19. The method of claim 1, further comprising annealing the magnetic layer in a magnetic field.

20. A method comprising:

forming a dielectric layer over a semiconductor substrate;

depositing a first adhesion layer over the dielectric layer;

depositing a magnetic material layer comprising an amorphous alloy which includes cobalt over the first adhesion layer;

depositing a second adhesion layer over the magnetic material layer; and patterning the magnetic layer and both adhesion layers using a mask to form an inductor as part of a semiconductor based integrated circuit.

21. The method of claim 20, wherein the amorphous alloy comprises cobalt and zirconium.

22. The method of claim 20, wherein the depositing the magnetic material layer includes depositing magnetic material in a fixed or switching magnetic field.

23. The method of claim 20, wherein the patterning comprises wet etching the magnetic material layer using a nitric acid solution.

24. The method of claim 20, wherein the patterning comprises etching the adhesion layers using a hydrofluoric acid solution.

* * * * *